US005518858A

United States Patent [19]

[11] Patent Number: 5,518,858
[45] Date of Patent: May 21, 1996

Dyukova et al.

[54] PHOTOCHROMIC COMPOSITIONS AND MATERIALS CONTAINING BACTERIORHODOPSIN

[75] Inventors: Tatyana V. Dyukova; Nicolai N. Vsevolodov, both of Gaithersburg, Md.

[73] Assignee: The United States of America as represented by the Secretary of Commerce, Washington, D.C.

[21] Appl. No.: 249,605

[22] Filed: May 26, 1994

[51] Int. Cl.$^{6}$ .......... G03F 7/008

[52] U.S. Cl. .......... 430/167; 430/196; 430/197; 430/270.14; 430/495.1; 430/945; 430/962; 435/71.1; 435/71.2; 530/802; 530/825; 530/400

[58] Field of Search .......... 430/196, 338, 430/962, 340, 495, 945, 167, 197, 270.14

[56] References Cited

U.S. PATENT DOCUMENTS

| | | | |
|---|---|---|---|
| 3,508,810 | 4/1970 | Baltzer | 350/160 |
| 3,715,212 | 2/1973 | Ross | 96/48 |
| 4,084,967 | 4/1978 | O'Brien | 96/29 R |
| 4,356,256 | 10/1982 | O'Brien | 430/332 |
| 4,728,591 | 3/1988 | Clark et al. | 430/5 |
| 5,041,224 | 8/1991 | Ohyama et al. | 210/500.27 |
| 5,079,149 | 1/1992 | Neumann et al. | 435/712 |
| 5,223,355 | 6/1993 | Hampp et al. | 430/1 |
| 5,223,411 | 6/1993 | Plusquelle et al. | 435/71.2 |
| 5,228,001 | 7/1993 | Birge et al. | 365/215 |
| 5,253,198 | 10/1993 | Birge et al. | 365/106 |
| 5,279,932 | 1/1994 | Miyasaka et al. | 430/495 |
| 5,346,789 | 9/1994 | Lewis et al. | 430/962 |
| 5,374,492 | 12/1994 | Hampp et al. | 430/2 |

FOREIGN PATENT DOCUMENTS

| | | |
|---|---|---|
| 1032912 | 2/1981 | U.S.S.R. . |
| 1194177 | 9/1983 | U.S.S.R. . |

OTHER PUBLICATIONS

Burykin et al., Optics Communications, 1985, vol. 54, No. 2, pp. 68–71.

Birge et al., Proc. XII Ann. Internat. IEEEE–EMBS Conference, 1990, vol. 12, No. 4/5, 1788–1789.

Hampp et al., Biophys., 1990, vol. 58, pp. 83–93.

Becher et al., Prep. Biochem., vol. 5, pp. 161–178.

Hampp et al., Applied Optics, 1992, vol. 31, No. 11, pp. 1834–1841.

Chemical Abstracts—83:93449e—1975.

Chemical Abstracts—85:16959K—1976.

Chemical Abstracts—97:194754v—1982.

Chemical Abstracts—103:118502p—1985.

Chemical Abstracts—105:167196a—1986.

Chemical Abstracts—110:104619q—1989.

Chemical Abstracts—110:11820j—1989.

Chemical Abstracts—115:38729a—1991.

Chemical Abstracts 114:1327i90q—1991.

Chemical Abstracts—115:146483z—1991.

Chemical Abstracts 115:102690k—1991.

Brown et al, *Biophysics,* 1992, vol. 37, No. 1, pp. 66–71.

Jackson, *Optica Acta,* 1969, vol. 16, No. 1, pp. 1–16.

Bunkin et al, *Sov. Tech. Phys. Lett.,* 1981, 7 (12), pp. 630–631.

Blaurock, *Nature New Biology,* 1971, vol. 233, pp. 152–155.

*Primary Examiner*—John S. Y. Chu
*Attorney, Agent, or Firm*—Lowe, Price, LeBlanc & Becker

[57] ABSTRACT

Photochromic compositions comprise a bacteriorhodopsin suspension, at least one organic nitrogen-containing compound and a binder. The composition may further include a detergent. Photochromic materials comprise a support and a photochromic film formed on the support from a photochromic composition as described.

11 Claims, 1 Drawing Sheet

PHOTOCHROMIC COMPOSITIONS AND MATERIALS CONTAINING BACTERIORHODOPSIN

FIELD OF THE INVENTION

The present invention relates to photochromic compositions and photochromic materials formed from the light-sensitive protein, bacteriorhodopsin. More specifically, the present invention relates to such photochromic compositions and materials further including at least one organic nitrogen-containing compound and a binder.

BACKGROUND OF THE INVENTION

Photochromism is a property of a material to reversibly change its optical density or color, i.e. its absorption spectrum shape and/or position, under illumination. Photochromic materials are well known for use in recording and processing of optical information. Generally, an image appears on photochromes during light exposure and is stored for some time, referred to as the time of information storage, and may be erased by light, heat or other means, or fades spontaneously prior to a new recording.

Bacteriorhodopsin is a natural retinal-protein complex and was discovered to be a light-sensitive protein. Bacteriorhodopsin may be isolated from the halophilic bacteria *Halobacterium salinarium,* which inhabits salt lakes. The former name of this microorganism is *Halobacterium halobium.* Bacteriorhodopsin runs through a photochemical cycle during which the shift of the wavelength maximum of the initial absorption band takes places successively in both directions. Bacteriorhodopsin has been embedded into polymeric matrices in the form of films or blocks, Burykin et al., *Optics Communications,* 1985, Vol. 54, No. 2, pp. 68–71. Photochromic films have been developed containing bacteriorhodopsin or analogs thereof and polyvinyl alcohol, Birge et al., *Proc. XII Ann. Internat. IEEEE–EMBS Conference,* 1990, Vol. 12, No. 4/5, 1788–1789; Hampp et al., *Biophys. J,* 1990, Vol. 58, pp. 83–93. These films exhibit high cyclicity and high resolution owing to the bacteriorhodopsin molecule. However, the photosensitivity of these films, an important sensometric parameter, does not exceed $10^{-1}$–$10^{-2}$ J/cm$^2$.

U.S.S.R. Author's Certificate No. 1,032,912 (1983) discloses a photochromic material containing bacteriorhodopsin analogs and a polymeric binder, such as polyvinyl alcohol or a polyvinyl-N-pyrrolidone. The disclosed material provides an information storage mime of up to several hours and a relatively wide visible spectral range of use. The energetic sensitivity of the material was disclosed as approximately $10^{-2}$ J/cm$^2$. However, the material exhibited low energetic sensitivity and was not optically homogeneous. As a result, the signal to noise characteristics of the material were disadvantageously effected and the recorded optical information was distorted.

U.S.S.R. Author's Certificate No. 1,194,177 (1985) discloses natural retinal-protein complex in a form of an aqueous suspension of purple membranes of *Halobacterium salinarium,* polyvinyl alcohol as a polymeric binder and a combination of nitrogen-containing chemicals. The nitrogen-containing chemicals increased the energetic sensitivity in the visible range up to $2\times10^{-3}$ J/cm$^2$. However, this material exhibited insufficient optical homogeneity and insufficient energetic sensitivity in the visible spectral range.

Accordingly, a need exists for new photochromic materials exhibiting high sensitivity, high cyclicity and high energetic sensitivity in the visible spectral range.

SUMMARY OF THE INVENTION

It is an object of the present invention to provide new photochromic compositions and photochromic materials which exhibit a good combination of properties. It is a further object of the invention to provide photochromic compositions and photochromic materials which exhibit increased photosensitivity and increased information storage time. It is a further object of the invention to provide photochromic compositions and materials which may be applied in the recording and storage of information in real time in optical systems and technical devices, including dynamic holography wherein higher energetic sensitivity, resolution and cyclicity of the photochromic material are required.

These and additional objects are provided by the photochromic compositions and photochromic materials of the present invention. Specifically, the photochromic compositions of the invention comprise a bacteriorhodopsin suspension, sodium azide, at least one organic nitrogen-containing compound and a binder. The compositions may further include a detergent. The organic nitrogen-containing compounds increase the energetic sensitivity of the photochromic compositions and materials in the visible spectral range. Additionally, the compositions allow the preparation of a more optically homogeneous photochromic material layer.

These and additional objects and advantages will be more fully apparent in view of the following detailed description.

BRIEF DESCRIPTION OF THE DRAWING

The present invention will be more fully understood in view of the drawing which comprises a FIGURE showing the complete transition of bacteriorhodopsin molecules to the M state upon exposure to yellow light of a Kodak projector.

DETAILED DESCRIPTION

Figure 1:
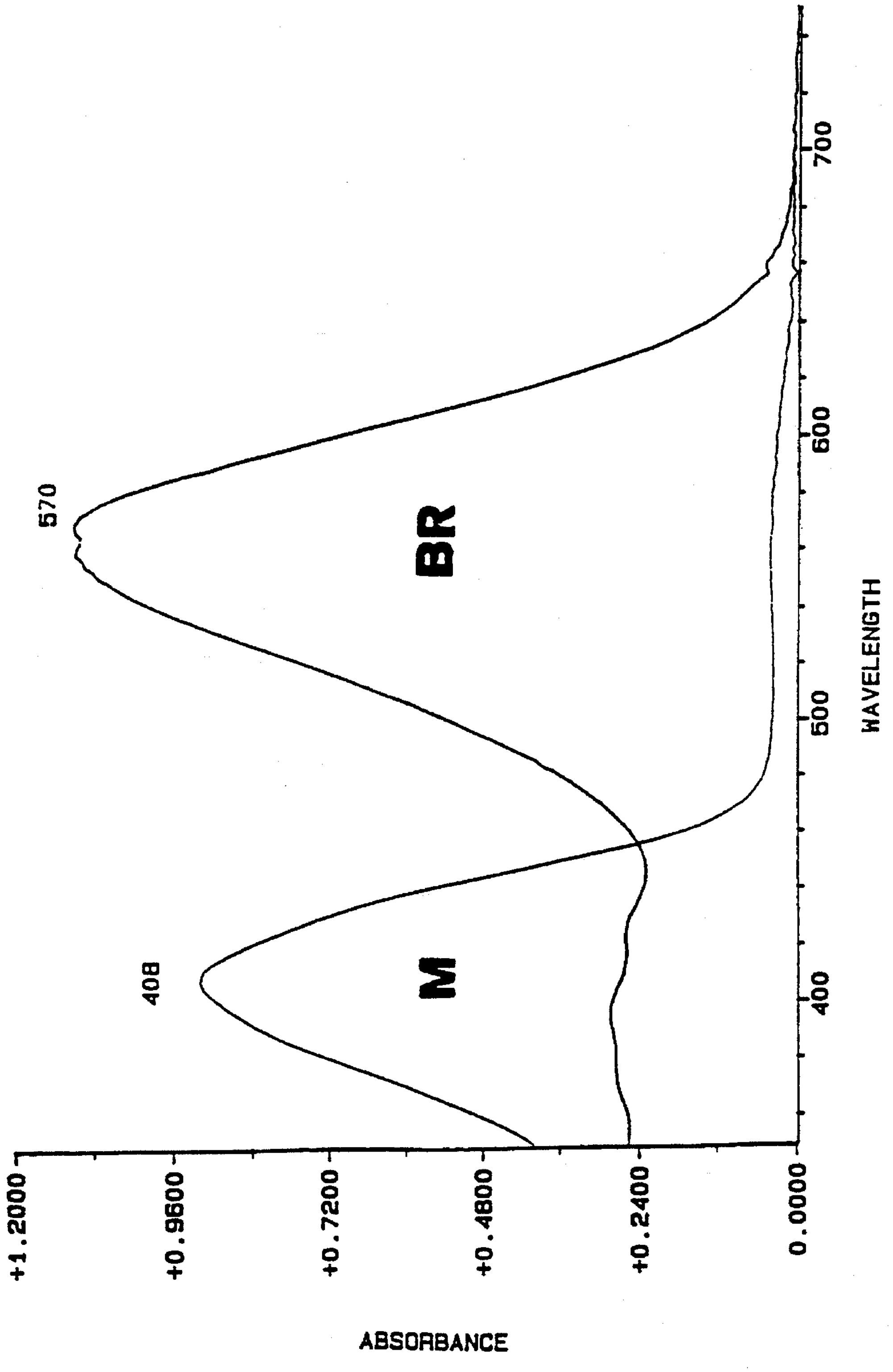

The photochromic compositions according to the present invention comprise a bacteriorhodopsin suspension, at least one organic nitrogen-containing compound and a binder. Bacteriorhodopsin is a natural retinal-protein complex isolated from the halophilic bacteria *Halobacterium salinarium.* Preferably, the bacteriorhodopsin is used in the form of an aqueous suspension of purple membranes. Purple membrane fragments may be isolated from *Halobacterium salinarium,* ET 1000, according to the procedure described by Becher et al., *Prep. Biochem.,* 1975, Vol. 5, #2, pp 161–178, which is incorporated herein by reference. Mutant bacteriorhodopsin, for example, as disclosed by Hampp et al., *Applied Optics,* 1992, Vol. 31, No. 11, pp 1834 –1841, incorporated herein by reference, may also be employed. As will be demonstrated in the examples, a preferred composition of the present invention comprises an aqueous suspension of bacteriorhodopsin, gelatin and sodium azide ($NaN_3$). Preferably, the bacteriorhodopsin and the sodium azide are employed in about a 1:20 molar ratio.

The organic nitrogen-containing compound which is employed in the photochromic compositions and materials of the present invention preferably comprises an amine, an amine salt or a mixture thereof. Examples of preferred organic nitrogen-containing compounds include guanidine hydrochloride, arcaine sulfate, 1,2-diaminopropane, triethanolamine, and N,N,N',N'-tetamethylethylenediamine, and mixtures thereof. More preferably, the organic nitrogen containing compound comprises a mixture of at least one first compound selected from the group consisting of amine salts such as guanidine hydrochloride and arcaine sulfate, and at least one second compound selected from the group consisting of amines such as 1,2-diaminopropane, triethanolamine, and N,N,N',N'-tetramethylethylenediamine. More preferably, when the organic nitrogen-containing compound comprises a mixture of these first and second compounds, the first compound and the second compound are employed in a weight ratio of from about 1:100 to about 1:200. In another preferred embodiment, it is preferred that the weight ratio of the first compound in the mixture of organic nitrogen-containing compounds to the sodium azide in the composition is from about 1:3 to about 1:5.

Preferred photochromic compositions include organic nitrogen-containing compounds and sodium azide in the following ratios:

guanidine hydrochloride: 1,2-diaminopropane: sodium azide in a weight ratio of 1:153:4;

guanidine hydrochloride: triethanolamine: sodium azide in a weight ratio 1:153:4;

arcane sulfate: triethanolamine: sodium azide in a weight ratio of 1:153:4;

arcaine sulfate: 1,2-diaminopropane: sodium azide in a weight ratio of 1:153:4;

N,N,N',N'- tetramethylethylenediamine: 1,2-diaminopropane: sodium azide in a weight ratio of 1:21:4;

arcaine sulfate: N,N,N', N'tetramethylethylenediamine:triethanolamine:sodium azide in weight ratio of 1:7:153:4;

arcaine sulfate: N,N,N',N' tetramethylethylenediamine: 1,2-diaminopropane: sodium azide in a weight ratio of 1:7:153:4;

guanidine hydrochloride: N,N,N',N' tetramethylethylenediamine: 1,2-diaminopropane: sodium azide in weight ratio of 1:7:153:4;

guanidine hydrochloride: N,N,N',N' tetramethylethylenediamine: 1,2-diaminopropane: sodium azide in a weight ratio of 1:7:153:4.

The binder which is included in the photochromic compositions and materials of the present invention is selected to provide, in combination with the other components, an optically homogeneous photochromic film. In a preferred embodiment, the binder comprises gelatin, although other polymeric binders which satisfy the above requirement may be employed. Examples of such polymeric binders include those set forth in U.S. Pat. Nos. 3,715,212 and 3,508,810, both of which are incorporated herein by reference.

The photochromic compositions according to the present invention preferably comprise from about 8 to about 25 wt. % of the bacteriorhodopsin suspension, from about 10 to about 15 wt. % of the nitrogen-containing organic compound and a balance of the binder. In preferred embodiments, the photochromic compositions may further include a detergent, for example, in an amount from about 1.0 to 50 wt. %. More preferably, photochromic compositions in accordance with the present invention contain from about 8.6 to about 25.0 wt. % of the bacteriorhodopsin suspension, from about 14.1 to about 14.9 wt. % of the organic nitrogen-containing compounds, from about 0.7 to about 41.8 wt. % detergent, and a balance of binder.

The photochromic compositions are preferably employed to prepare photochromic materials. The photochromic materials according to the invention may comprise a support and a photochromic film formed on the support. The support may be formed of any material well known in the optical recording art, including glass. The photochromic film is formed of a photochromic composition as described herein.

In a preferred embodiment, the photochromic materials according to the present invention are formed by layer casting wherein a photochromic composition is inserted between two supports with a spacer, followed by hardening of the mixture, removal of the upper support and drying of the layer.

Photochromic compositions and materials according to the present invention are demonstrated in the following examples. Throughout the examples and the present specification, parts and percentages are by weight unless otherwise specified.

EXAMPLE 1

Bacteriorhodopsin was used in a form of an aqueous suspension of purple membranes (PMs). PM fragments were isolated from the cells of the microorganism, *Halobacterium salinarium* ET 1000, (although other strains which satisfy the above requirement may be employed) according to the standard procedure of Becher et al., described above, and sonicated for a total of 4 min at 20 kHz in an ice bath. Gelatin was used as an aqueous 8% stock solution prepared as follows: 50ml of deionized water was added to 4 g of a photographic type 300 Bloom (Sigma) dry gelatin and the mixture allowed to swell for 24 h at 5° C. Afterward, the mixture was intensively stirred at 60° C. for 1.5 h. Sodium azide was added to the gelatin stock solution to a final concentration of $7.07\times10^{-3}$M. Mixing of the components was performed at 38° C. for 10–15 min. A volume of 0.6 ml of PM suspension (bacteriorhodopsin concentration being $7.236\times10^{-4}$M) was mixed with 1.2 ml of the 8% gelatin stock solution.

Generally layer casting includes the steps of preparing the photosensitive mixture, inserting the mixture between two supports with a spacer, the upper support being treated with a hydrophobic reagent, for example, $(CH_3)_2SiCl_2$, gelatinizing of the mixture for 1–1.5 h, removing the upper support and drying the layer at 5°–9° C. and a relative air humidity of 10–50%. The procedure of layer casting, two additional sonications of the components during the preparation of the mixture (resulting in more uniform distribution of the components) and drying the layer at low temperature, resulted in additional sensitivity increase and in the increase of the optical homogeneity of the layer.

In this example, the mixture was introduced between two 5×5 cm glass slides placed on a metal surface at 38° C. The upper slide was preliminary treated with $(CH_3)_2SiCl_2$. The temperature of the surface was reduced to 9° C. and the mixture was allowed to gel for 1.5 h. The upper support was then removed. The sample was allowed to dry in a box at 9° C. and relative air humidity of 15±5% for 44–48 h. The thickness of the dried sample obtained with an 800μ spacer was approximately 50μ. The optical density of the sample at λ max was 1.1 au. The final volume of 1.8 ml was required to prepare a 16.8 $cm^2$ sample with an 800μ spacer. The spacer may vary depending on the desired thickness of the film and its optical density.

EXAMPLE 2

A volume of 0.6 ml of PM suspension as described in Example 1 was mixed with 0.0107 ml of aqueous 0.0437M arcaine sulfate and additionally sonicated for a total of 1 min at 20 kHz in an ice bath. This procedure provided more homogeneous distribution of the additives. After sonication, 1.2 ml of 8% gelatin and 0.017 ml of triethanolamine were successively added to the PM suspension at 35° C. with continuous stirring of the mixture. All the other procedures of Example 1 were followed to form a film.

EXAMPLE 3

A volume of 0.6 ml of PM suspension as described in Example 1 was mixed with 0.03 ml of 0.044M aqueous guanidine hydrochloride and additionally sonicated for a total of 1 min at 20 kHz in an ice bath. After sonication, 1.2 ml of 8% gelatin and 0.017 ml of triethanolamine were successively added to the PM suspension at 38° C. with continuous stirring of the mixture. All the other procedures of Example 1 were followed to form a film.

EXAMPLE 4

A volume of 0.6 ml of PM suspension as described in Example 1 was mixed with 0.0107 ml of 0.0437M aqueous arcaine sulfate and additionally sonicated for a total of 1 min at 20 kHz in an ice bath. After sonication, 1.2 ml of 8% gelatin, 0.0025 ml of 0.5M aqueous N,N,N', N'tetramethylethylenediamine and 0.017 ml of triethanolamine were successively added to the PM suspension at 38° C. with continuous stirring of the mixture. All the other procedures of Example 1 were followed to form a film.

EXAMPLE 5

A volume of 0.6 ml of PM suspension as described in Example 1 was mixed with 0.03 ml of 0.044M aqueous guanidine hydrochloride and additionally sonicated for 1 min at 20 kHz in an ice bath. After sonication, 1.2 ml of 8% gelatin and 0.022 ml of 1,2-diaminopropane were successively added to the PM suspension at 38° C. with continuous stirring of the mixture. All the other procedures of Example 1 were followed to form a film.

EXAMPLE 6

A volume of 0.6 ml of PM suspension as described in Example 1 was mixed with 0.0107 ml of 0.0437M aqueous arcaine sulfate and additionally sonicated for a total of 1 min at 20 kHz in an ice bath. After sonication, 1.2 ml of 8% gelatin and 0.022 ml of 1,2-diaminopropane were successively added to the PM suspension at 38° C. with continuous stirring of the mixture. All the other procedures of Example 1 were followed to form a film.

EXAMPLE 7

A volume of 0.6 ml of PM suspension as described in Example 1 was mixed with 0.0025 ml of 0.5M aqueous N,N,N',N'-tetramethylethylenediamine and further sonicated for a total of 1 min at 20 kHz in an ice bath. After sonication, 1.2 ml of 8% gelatin and 0.022 ml of 1,2-diaminopropane were successively added to the PM suspension at 38° C. with continuous stirring of the mixture. All the other procedures of Example 1 were followed to form a film.

EXAMPLE 8

A volume of 0.6 ml of PM suspension as described in Example 1 was mixed with 0.0107 ml of 0.0437M aqueous arcaine sulfate and additionally sonicated for a total of 1 min at 20 Khz in an ice bath. After sonication, 1.2 ml of 8% gelatin, 0.022 ml of 1,2-diaminopropane and 0.0025ml of 0.5M aqueous N,N,N',N'-tetramethylethylenediamine were successively added to the PM suspension at 38° C. with continuous stirring of the mixture. All the other procedures of Example 1 were followed to form a film.

EXAMPLE 9

A volume of 1.05 ml of PM suspension as described in Example 1 which was preliminary sonicated for a total of 6 min at 20 Khz in an ice bath, was mixed with 0.072 ml of 20% (w/w) Triton X-100 solution and incubated at 5° C. for 28 h with continuous stirring of the mixture. Bacteriorhodopsin/Triton molar ratio was 1:30. The temperature of the suspension was adjusted to 38° C. and mixed with 0.9 ml of 8% gelatin solution for 5 min. The described mixture is ready to be applied to a glass support described in Example 1.

EXAMPLE 10

A volume of 0.91 ml of PM suspension which was preliminary sonicated for a total of 4 min at 20 kHz in an ice bath, was mixed with 0.17 ml of 1.368M Octyl-β-d-glucoside and incubated at 5° C. for 28 h with continuous stirring of the mixture. Bacteriorhodopsin/Octylglucoside molar ratio was 1:350. All the other procedures of Example 9 were followed.

The optical density of the dried samples λmax was 1.1+0.1 au. The absorption and difference spectra (dark/light) of the samples were taken with an HP 8452A spectrophotometer. Kinetic measurements were performed at 560 nm (the initial absorption band of bacteriorhodopsin) and 406 nm (the photoinduced absorption band of bacteriorhodopsin). Illumination of the samples were performed with a He—Ne laser (power density of 13 $mW/cm^2$) or a Kodak projector through a yellow filter (power density of 22.5 $mW/cm^2$). FIG. 1 shows the complete transition of bacteriorhodopsin molecules to the M state upon irradiation with yellow light of the Kodak projector.

The preceding examples are set forth to illustrate specific embodiments of the invention and are not intended to limit the scope of the compositions and materials of the present invention. Additional embodiments and advantages within the scope of the claimed invention with be apparent to one of ordinary skill in the art.

We claim:

1. A photochromic composition, comprising an aqueous bacteriorhodopsin suspension, at least one nitrogen-containing compound, a detergent, and a gelatin binder.

2. A photochromic composition as defined by claim 1, comprising from about 8 to about 25 weight percent of the aqueous bacteriorhodopsin suspension, from about 10 to about 15 weight percent of the at least one nitrogen-containing compound, from about 1.0 to about 50 weight percent of the detergent and a balance of the gelatin binder.

3. A photochromic composition as defined by claim 2, further comprising sodium azide in an amount to provide a bacteriorhodopsin:sodium azide molar ratio of 1:20.

4. A photochromic composition as defined by claim 1, wherein the nitrogen-containing compound is selected from the group consisting of amines, amine salts, and mixtures thereof.

5. A photochromic composition as defined by claim 1, wherein the nitrogen-containing compound is selected from the group consisting of guanidine hydrochloride, arcaine sulfate, 1,2-diaminopropane, triethanolamine, and N,N,N',N'-tetramethylethylenediamine, and mixtures thereof.

6. A photochromic composition as defined by claim 5, wherein the nitrogen-containing compound comprises a mixture of at least one first compound selected from the group consisting of guanidine hydrochloride and arcaine sulfate, and at least one second compound selected from the group consisting of 1,2-diaminopropane, triethanolamine, and N,N,N',N'-tetramethylethylenediamine.

7. A photochromic composition as defined by claim 6, wherein the photochromic composition comprises a mixture of the first compound and the second compound in a weight ratio of from about 1:100 to about 1:200.

8. A photochromic composition as defined by claim 6, wherein the aqueous bacteriorhodospin suspension further comprises sodium azide and the weight ratio of the first compound in the mixture of nitrogen-containing compounds to the sodium azide is from about 1:3 to about 1:5.

9. A photochromic material, comprising a support and a photochromic film formed on the support, the photochromic film being formed of a composition comprising an aqueous bacteriorhodopsin suspension, at least one nitrogen-containing compound, a detergent and a gelatin binder.

10. A photochromic material as defined by claim 9, wherein the photochromic film is formed of a composition comprising from about 8 to about 25 weight percent of the aqueous bacteriorhodopsin suspension, from about 10 to about 15 weight percent of the at least one nitrogen-containing compound, from about 1.0 to about 50 weight percent of the detergent and a balance of the gelatin binder.

11. A photochromic material as defined by claim 9, wherein the nitrogen-containing compound comprises a mixture of at least one first compound selected from the group consisting of guanidine hydrochloride and arcaine sulfate, and at least one second compound selected from the group consisting of 1,2-diaminopropane, triethanolamine, and N,N,N',N'-tetramethylethylenediamine.

* * * * *